(12) United States Patent
Sumiya et al.

(10) Patent No.: US 8,377,211 B2
(45) Date of Patent: Feb. 19, 2013

(54) DEVICE FOR VACUUM PROCESSING

(75) Inventors: Masatomo Sumiya, Ibaraki (JP); Mikk Lippmaa, Tokyo (JP); Tsuyoshi Ohnishi, Tokyo (JP); Eiji Fujimoto, Ibaraki (JP); Hideomi Koinuma, Tokyo (JP)

(73) Assignee: National Institute for Materials Science, Ibaraki (JP)

( * ) Notice: Subject to any disclaimer, the term of this patent is extended or adjusted under 35 U.S.C. 154(b) by 902 days.

(21) Appl. No.: 12/309,533

(22) PCT Filed: Feb. 1, 2007

(86) PCT No.: PCT/JP2007/051718
§ 371 (c)(1),
(2), (4) Date: Jul. 1, 2009

(87) PCT Pub. No.: WO2008/012956
PCT Pub. Date: Jan. 31, 2008

(65) Prior Publication Data
US 2010/0058987 A1    Mar. 11, 2010

(30) Foreign Application Priority Data
Jul. 25, 2006    (JP) ................... 2006 202634

(51) Int. Cl.
*C23C 16/00*    (2006.01)

(52) U.S. Cl. ......... 118/725; 118/715; 438/308; 438/795
(58) Field of Classification Search ....................... None
See application file for complete search history.

(56) References Cited

U.S. PATENT DOCUMENTS
6,617,539 B1    9/2003    Koinuma et al.

FOREIGN PATENT DOCUMENTS
| JP | 2000-087223 | 3/2000 |
| JP | 3268443 | 1/2002 |
| JP | 2004-035958 | 2/2004 |

OTHER PUBLICATIONS
International Search Report mailed Apr. 17, 2007 for International Application No. PCT/JP2007/051718.

*Primary Examiner* — Robert Xu
(74) *Attorney, Agent, or Firm* — Wenderoth, Lind & Ponack, L.L.P.

(57) ABSTRACT

Disclosed is a device for vacuum processing that performs vapor-deposition on a substrate being heated in a vacuum chamber; the device, wherein the chamber has a light transmissible window formed in a section of the chamber; the light transmissible window and a holding part holding the substrate are connected by a linear space isolated from other parts in the chamber; a laser emitter is installed outside the light transmissible window; and the laser emitter emits a laser beam to the substrate through the linear space, thereby heating the substrate. This device enables laser heating, eliminating conventional drawbacks such as a decrease in laser output.

2 Claims, 1 Drawing Sheet

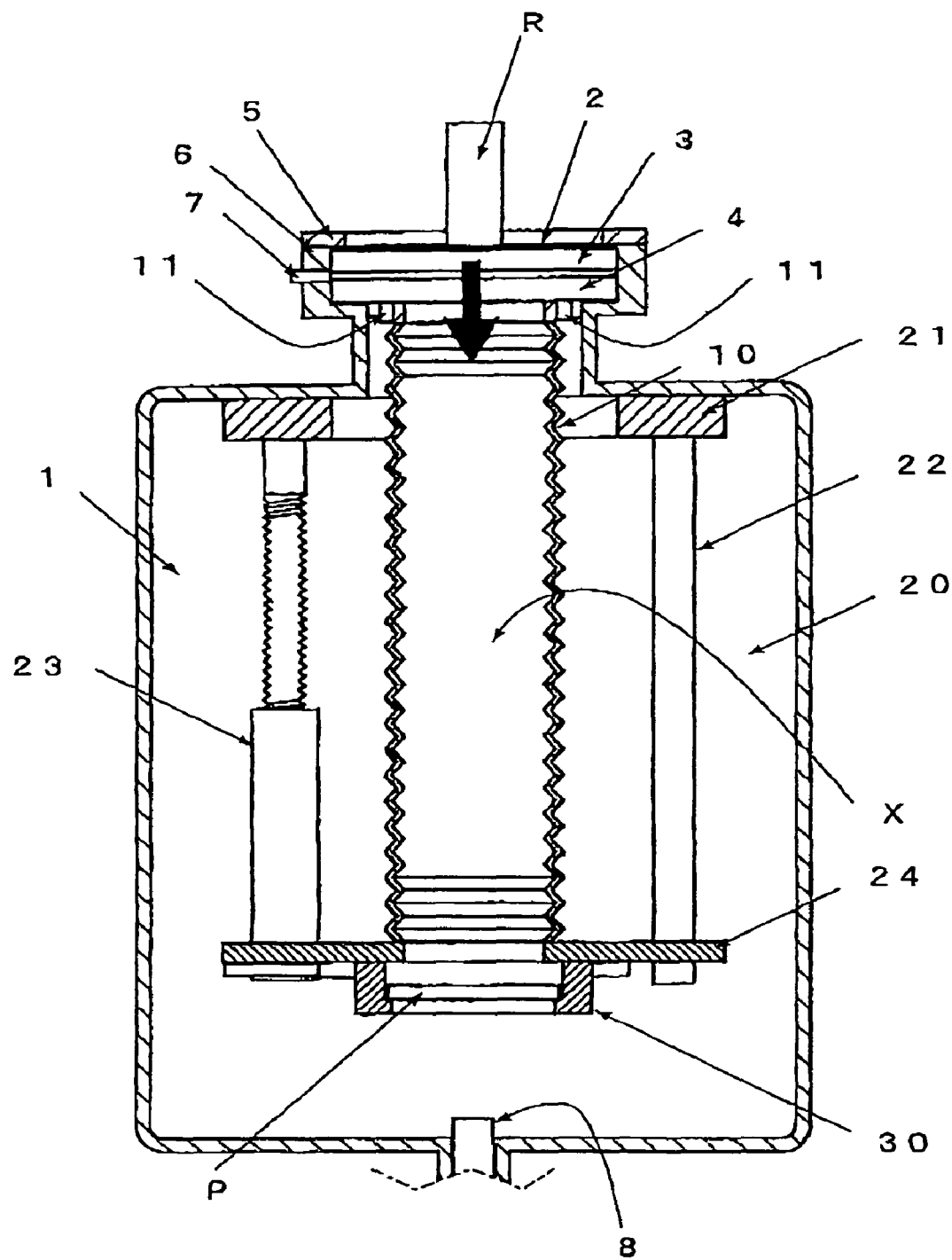

DEVICE FOR VACUUM PROCESSING

TECHNICAL FIELD

The present invention relates to devices for vacuum processing that perform vapor-deposition on a substrate being heated in a vacuum chamber. In particular, the invention relates to devices for vacuum processing characterized by a heating system optimal for a process that requires growth using AlN, BN, or bulk Si at high temperatures or for a thin film growth process that requires a speedy change in the substrate temperature, as in making a ZnO thin film p-type.

BACKGROUND ART

Conventionally, temperature is an important parameter in material development. In vacuum processing of vapor-deposition performance on a substrate being heated, an approach in which the light of a heater is condensed using a heating wire or an infrared lamp is generally employed for heating. However, this conventional method has problems that make it difficult to heat a substrate to 1000° C. or higher. Sample problems that hinder temperature increase include heater disconnections or film adhesion and formation on the condenser lens used for the lamp (particularly in processes such as CVD that require high pressure). In order to heat a substrate to 1000° C. or higher, special heater with a carbon or SiC resistor is employed; heating graphite by heat induction has also been attempted. However, since the carbon heater itself is highly susceptible to oxidation and a reducing atmosphere, the surface of the carbon heater must be coated with an atmosphere-resistant substance such as BN. On the other hand, the heat induction system has other problems, such as an inability to use a metal chamber, complicated substrate conveyance, and low degree of design freedom.

A laser heater (Patent Document 1) that uses a high output laser as a heat source has been proposed as a means to solve the aforementioned problems.

However, even though the laser heater guides the laser beam is guided to an area near a substrate by means of an optical fiber, a thin film also adheres to the end face of the fiber during the thin film deposition process, such as the CVD method, which requires a relatively high pressure (several mTorr or higher) since the end face of the optical fiber is exposed in a thin-film forming device. As a result, the laser output and hence temperature decreases and the laser body is damaged by the reflected light.

Patent Document 1: Japanese Patent No. 3268443

DISCLOSURE OF INVENTION

Problems to be Solved by the Invention

The present invention has been proposed in view of the foregoing and accordingly, an object of the present invention to provide a novel device for vacuum processing that enables laser heating by solving conventional drawbacks such as a laser output decrease.

Means for Solving Problems

In order to attain the object, the invention first provides a device for vacuum processing that performs vapor-deposition on a substrate being heated in a vacuum chamber, wherein the chamber has a light transmissible window in a section of the chamber; the light transmissible window and a holding part holding the aforementioned substrate are connected by a linear space isolated from other parts in the chamber; a laser emitter is installed outside the light transmissible window; and the laser emitter emits a laser beam to the substrate through the linear space, thereby heating the substrate.

Second, the invention provides the device for vacuum processing as described above, wherein the linear space has a cylindrical form connecting the internal face of the light transmissible window and the holding part.

Effect of the Invention

In the present invention, the laser beam in linear space does not come into contact with the thin film or vapor occupying other parts in the chamber. Accordingly, the laser beam reaches the substrate without being attenuated. This makes it possible to change the substrate temperature in a short time during thin film deposition using, for example, the CVD method. Furthermore, the substrate can be stably heated to as high as 1500° C. or higher (for example) for a long time.

BRIEF DESCRIPTION OF DRAWING

FIG. 1 is a sectional view showing an embodiment, of a device for vacuum processing according to the present invention.

EXPLANATION OF LETTERS OR NUMERALS (1) vacuum chamber
(2) anti-reflection film
(3) upper reinforcement glass plate
(4) lower reinforcement glass plate
(5) mounting flange
(6) window
(7) anti-fog gas inlet
(8) evaporator outlet
(10) cylinder
(11) stay
(20) substrate raising/lowering device
(21) upper frame
(22) guide post
(23) extensible screw post
(24) lower frame
(30) holding part
(R) laser emitter
(P) substrate
(X) linear space

BEST MODE FOR CARRYING OUT THE INVENTION

One embodiment of the present invention will hereinafter be described. Of course, the invention is not limited thereto.

FIG. 1 is a vertical view showing an embodiment of a device for vacuum processing in the present invention.

A vacuum chamber (1) has a light transmissible window (6) at the top. The light transmissible window (6) is fixed by a fixing flange (5) so that a space having an anti-fog gas inlet (7) is left between upper and lower reinforcement glass plates (3) and (4). An anti-reflection film (2) is formed on the upper face of the upper reinforcement glass (3).

A high output semiconductor laser emitter (R) of collimation type is installed above the upper reinforcement glass (3) so that the direction of emission is oriented downward (indicated by the black arrow in FIG. 1).

A substrate raising/lowering device (20) in the vacuum chamber (1) is configured such that an upper frame (21) fixed to the upper part of the vacuum chamber (1) and a lower frame (24) having a holding part (30) holding a substrate (P) in the center thereof are connected by an extensible screw post (23) and a guide post (22).

Such a structure makes it possible to raise or lower the lower frame (24) by extending or shortening the extensible screw post (23).

A bellows-like cylinder (10), which can be extended, connects the space above the holding part (30) and the space below the reinforcing glass (4). The upper end of the cylinder (10) is in close contact with the lower face of the lower reinforcement glass (4) and is fixed to the internal face of the window (6) by a stay (11). The bellow-like cylinder (10) may be formed from a metal such as aluminum that is impervious to reactive or impure gasses for deposition; its alloy; ceramics; or a composite of these.

The lower end of the bellows-like cylinder (10) is fixed to the upper face of the lower frame (24).

Thus, the light transmissible window (6) and the substrate (P) are connected by a linear space (X) that is isolated from the other sections.

Installed in the chamber (1) is an evaporator outlet (8) through which various kinds of vapors are introduced.

The foregoing configuration makes it possible to transmit a laser beam within the linear space (X) without being affected by the vapor from the evaporator outlet (8). Accordingly, the substrate (P) can be stably heated to a high temperature.

Instead of a high output semiconductor laser emitter (R) of collimation type, the leading ends of optical fibers protruding from various laser emitters installed in other places may be installed in the location of the semiconductor laser emitter.

This removes the limitations on installation space and allows the use of a larger laser emitter. In the present invention, the materials of the various members of the device for vacuum processing may be identical with those of conventional devices for vacuum processing. As described above, the semiconductor laser is used as an example of a laser medium. However, a liquid laser, gas laser, solid laser, or other laser may be used instead. In order to heat the substrate (P) to temperatures of 1500° C. or higher, which are higher than those in conventional devices, a laser-absorbent material is generally used, thus preventing deterioration of the holding part (30). It is preferable to use a material coated with a metal oxide, ceramics, or the like. In order to prevent evaporation of the coating, it is desirable to use a material protected with a transparent substance.

Such a device in the present invention described above makes it possible to form various kinds of films by heating a substrate to, for example, 1500° C. or higher, which has been considered extremely difficult to achieve. Accordingly, the device in the present invention contributes to practical use of the new advanced technology for forming a film.

Needless to say, the invention is not limited to the foregoing examples and various changes and modifications may be made thereto.

The invention claimed is:

1. A device for vacuum processing that performs vapor-deposition on a substrate being heated in a vacuum chamber, wherein
   the chamber has a light transmissible window formed in a section of the chamber;
   the light transmissible window and a holding part holding the substrate are connected by a linear space isolated from other parts in the chamber, wherein one end of the linear space is the light transmissible window, the other end of the linear space is the substrate;
   a laser emitter is installed outside the light transmissible window; and
   the laser emitter emits a laser beam to the substrate through the linear space, thereby heating the substrate.

2. The device for vacuum processing according to claim 1, wherein the linear space has the form of a cylinder connecting the internal face of the light transmissible window and the holding part.

\* \* \* \* \*